United States Patent
Tian et al.

(10) Patent No.: US 10,985,595 B2
(45) Date of Patent: Apr. 20, 2021

(54) ADAPTER AND METHOD OF CONTROLLING CHARGING PROCESS

(71) Applicant: GUANGDONG OPPO MOBILE TELECOMMUNICATIONS CORP., LTD., Dongguan (CN)

(72) Inventors: Chen Tian, Dongguan (CN); Jialiang Zhang, Dongguan (CN)

(73) Assignee: GUANGDONG OPPO MOBILE TELECOMMUNICATIONS CORP., LTD., Dongguan (CN)

(*) Notice: Subject to any disclaimer, the term of this patent is extended or adjusted under 35 U.S.C. 154(b) by 94 days.

(21) Appl. No.: 15/562,011

(22) PCT Filed: Jan. 7, 2017

(86) PCT No.: PCT/CN2017/070517
§ 371 (c)(1),
(2) Date: Sep. 27, 2017

(87) PCT Pub. No.: WO2017/133380
PCT Pub. Date: Aug. 10, 2017

(65) Prior Publication Data
US 2018/0269700 A1 Sep. 20, 2018

Related U.S. Application Data

(63) Continuation-in-part of application No. PCT/CN2016/073679, filed on Feb. 5, 2016.

(30) Foreign Application Priority Data

Jul. 26, 2016 (CN) .......................... 201610600612.3

(51) Int. Cl.
*H02J 7/00* (2006.01)
*H02J 7/06* (2006.01)
(Continued)

(52) U.S. Cl.
CPC .......... *H02J 7/027* (2013.01); *G01R 31/3842* (2019.01); *H01M 10/0525* (2013.01);
(Continued)

(58) Field of Classification Search
CPC ........ H02J 7/027; H02J 7/0029; H02J 7/0031; H02J 7/0052; H02J 7/007; H02J 7/008;
(Continued)

(56) References Cited

U.S. PATENT DOCUMENTS 4,087,733 A 5/1978 Casagrande
5,905,364 A 5/1999 Ookita
(Continued)

FOREIGN PATENT DOCUMENTS

CN 1228637 A 9/1999
CN 1564421 A 1/2005
(Continued)

OTHER PUBLICATIONS

Extended European search report issued in corresponding European application No. 17746700.8 dated Sep. 18, 2018.
(Continued)

*Primary Examiner* — Richard Isla
*Assistant Examiner* — Dung V Bui (57) ABSTRACT

An adapter and a method of controlling a charging process are provided. The adapter includes a power converting circuit and a control circuit. The power converting circuit is configured to convert inputted alternating current to generate output voltage and output current of the adapter, the power converting circuit comprising a secondary filter circuit. The control circuit is coupled to the secondary filter circuit and configured to control the secondary filter circuit to operate when the adapter operates in the first charging mode, so that the adapter outputs constant direct current, and configured to control the secondary filter circuit not to operate when the
(Continued)

adapter operates in the second charging mode, so that the adapter outputs an alternating current or a pulsating direct current.

26 Claims, 4 Drawing Sheets (51) Int. Cl.
| | |
|---|---|
| H02J 7/02 | (2016.01) |
| G01R 31/3842 | (2019.01) |
| H02M 3/335 | (2006.01) |
| H02J 7/04 | (2006.01) |
| H02M 7/217 | (2006.01) |
| H02M 1/08 | (2006.01) |
| H02M 7/06 | (2006.01) |
| H01M 10/0525 | (2010.01) |
| H01M 10/42 | (2006.01) |
| H01M 10/44 | (2006.01) |
| H02M 1/44 | (2007.01) |
| H02M 5/04 | (2006.01) |
| H02M 7/04 | (2006.01) |
| H02J 7/24 | (2006.01) |
| H02M 1/00 | (2006.01) |
| H02J 7/10 | (2006.01) |

(52) U.S. Cl.
CPC ......... *H01M 10/425* (2013.01); *H01M 10/44* (2013.01); *H02J 7/00* (2013.01); *H02J 7/007* (2013.01); *H02J 7/008* (2013.01); *H02J 7/0029* (2013.01); *H02J 7/0031* (2013.01); *H02J 7/0071* (2020.01); *H02J 7/00711* (2020.01); *H02J 7/00712* (2020.01); *H02J 7/00714* (2020.01); *H02J 7/007188* (2020.01); *H02J 7/007192* (2020.01); *H02J 7/02* (2013.01); *H02J 7/022* (2013.01); *H02J 7/04* (2013.01); *H02J 7/045* (2013.01); *H02J 7/06* (2013.01); *H02M 1/08* (2013.01); *H02M 1/44* (2013.01); *H02M 3/335* (2013.01); *H02M 3/33507* (2013.01); *H02M 3/33523* (2013.01); *H02M 3/33569* (2013.01); *H02M 3/33576* (2013.01); *H02M 3/33592* (2013.01); *H02M 5/04* (2013.01); *H02M 7/04* (2013.01); *H02M 7/06* (2013.01); *H02M 7/217* (2013.01); *H01M 10/4257* (2013.01); *H01M 2010/4271* (2013.01); *H02J 7/00034* (2020.01); *H02J 7/00036* (2020.01); *H02J 7/0042* (2013.01); *H02J 7/00043* (2020.01); *H02J 7/0047* (2013.01); *H02J 7/0049* (2020.01); *H02J 7/00304* (2020.01); *H02J 7/2434* (2020.01); *H02J 2007/10* (2013.01); *H02J 2207/10* (2020.01); *H02J 2207/20* (2020.01); *H02M 2001/0009* (2013.01)

(58) Field of Classification Search
CPC .. H02J 7/0093; H02J 7/022; H02J 7/04; H02J 7/041; H02J 7/045; H02J 7/047; H02J 7/06; H02J 2007/4271; H02J 2007/0039; H02J 2007/0059; H02J 2007/0062; H02J 2007/0096; H02J 2007/0098; H02J 2007/10; H02M 1/08; H02M 1/44; H02M 3/335; H02M 3/33507; H02M 3/33523; H02M 3/33569; H02M 3/33576; H02M 3/33592; H02M 5/04; H02M 7/04; H02M 7/06; H02M 7/217; H02M 2001/0009; G01R 31/3842; H01M 10/0525; H01M 10/425; H01M 10/44; H01M 2010/4271

USPC ........................................................ 320/137
See application file for complete search history.

(56) References Cited

U.S. PATENT DOCUMENTS

| | | | |
|---|---|---|---|
| 6,025,695 A | 2/2000 | Friel et al. | |
| 6,075,340 A | 6/2000 | Koenck | |
| 6,137,265 A | 10/2000 | Cummings et al. | |
| 6,184,660 B1* | 2/2001 | Hatular | H02J 7/022 320/139 |
| 6,198,645 B1* | 3/2001 | Kotowski | H02M 3/07 307/110 |
| 6,563,235 B1* | 5/2003 | McIntyre | H02M 3/07 307/109 |
| 6,909,617 B1 | 6/2005 | Mirskiy | |
| 7,468,898 B2* | 12/2008 | Ogata | H02M 3/07 307/109 |
| 7,999,517 B2 | 8/2011 | Arai et al. | |
| 8,159,091 B2* | 4/2012 | Yeates | H02M 3/07 307/110 |
| 8,788,852 B2* | 7/2014 | Chun | G06F 1/266 713/300 |
| 9,158,325 B1 | 10/2015 | Lim | |
| 2003/0058669 A1* | 3/2003 | Myono | H02M 3/07 363/62 |
| 2004/0090209 A1 | 5/2004 | Nishida et al. | |
| 2004/0263119 A1 | 12/2004 | Meyer et al. | |
| 2006/0284595 A1 | 12/2006 | Hsieh et al. | |
| 2007/0076443 A1 | 4/2007 | Yasumura | |
| 2007/0222416 A1 | 9/2007 | Sato | |
| 2008/0130336 A1 | 6/2008 | Taguchi | |
| 2008/0197811 A1 | 8/2008 | Hartular et al. | |
| 2010/0001683 A1* | 1/2010 | Huang | H02J 50/70 320/108 |
| 2010/0225291 A1* | 9/2010 | Kajino | H02M 3/07 323/283 |
| 2010/0253154 A1* | 10/2010 | Yeates | H02M 3/07 307/110 |
| 2012/0075891 A1 | 3/2012 | Zhang et al. | |
| 2012/0086393 A1 | 4/2012 | Gray | |
| 2012/0249054 A1* | 10/2012 | King | G07F 15/005 320/107 |
| 2012/0299557 A1* | 11/2012 | Kwon | H02J 7/025 320/166 |
| 2013/0009593 A1 | 1/2013 | Takahashi et al. | |
| 2013/0141034 A1 | 6/2013 | Huang et al. | |
| 2013/0147543 A1* | 6/2013 | Dai | H02M 3/07 327/536 |
| 2013/0221905 A1* | 8/2013 | Holloway | H02J 7/00 320/107 |
| 2013/0234655 A1 | 9/2013 | Miwa et al. | |
| 2013/0300375 A1 | 11/2013 | Von Novak et al. | |
| 2014/0028250 A1 | 1/2014 | Nishino | |
| 2014/0159641 A1 | 6/2014 | Geren | |
| 2014/0184189 A1* | 7/2014 | Salem | H02M 3/158 323/299 |
| 2014/0313792 A1* | 10/2014 | Nate | H02M 3/33523 363/21.15 |
| 2015/0069951 A1* | 3/2015 | Wang | H02J 7/00 320/107 |
| 2015/0180356 A1 | 6/2015 | Norisada et al. | |
| 2015/0260801 A1 | 9/2015 | Trent et al. | |
| 2016/0046196 A1 | 2/2016 | Baek | |
| 2016/0072376 A1 | 3/2016 | Ahlers et al. | |
| 2016/0111898 A1 | 4/2016 | Luo et al. | |
| 2016/0221455 A1 | 8/2016 | Ando et al. | |
| 2016/0359403 A1 | 12/2016 | Werner et al. | |
| 2016/0380462 A1 | 12/2016 | Zhang et al. | |
| 2017/0012451 A1 | 1/2017 | Zhang | |
| 2017/0018940 A1 | 1/2017 | Zhang | |

(56) References Cited

U.S. PATENT DOCUMENTS

| | | | |
|---|---|---|---|
| 2017/0187200 A1 | 6/2017 | Somerville et al. | |
| 2018/0214971 A1 | 8/2018 | Ihde | |

FOREIGN PATENT DOCUMENTS

| | | | |
|---|---|---|---|
| CN | 101051701 A | 10/2007 | |
| CN | 202026118 U | 11/2011 | |
| CN | 202059194 U | 11/2011 | |
| CN | 102447142 A | 5/2012 | |
| CN | 102545360 A | 7/2012 | |
| CN | 102916595 A | 2/2013 | |
| CN | 102957193 A | 3/2013 | |
| CN | 102364856 B | 10/2013 | |
| CN | 103762702 A | 4/2014 | |
| CN | 103795040 A | 5/2014 | |
| CN | 203747451 U | 7/2014 | |
| CN | 203872379 U | 10/2014 | |
| CN | 203981764 U | 12/2014 | |
| CN | 104810877 A | 7/2015 | |
| CN | 104810879 A | 7/2015 | |
| CN | 104917271 A | 9/2015 | |
| CN | 104967199 A | 10/2015 | |
| CN | 104967201 A | 10/2015 | |
| CN | 105098900 A | 11/2015 | |
| CN | 105472827 A | 4/2016 | |
| CN | 105576306 A | 5/2016 | |
| CN | 106026327 A | 10/2016 | |
| EP | 2228884 A2 | 9/2010 | |
| EP | 2887492 A2 | 6/2015 | |
| EP | 2930589 A1 | 10/2015 | |
| EP | 2980958 A1 | 2/2016 | |
| JP | S61244267 A | 10/1986 | |
| JP | S6289431 A | 4/1987 | |
| JP | S63184073 A | 7/1988 | |
| JP | 01086475 U | 6/1989 | |
| JP | H03189569 A | 8/1991 | |
| JP | H04138506 A | 5/1992 | |
| JP | H06165407 A | 6/1994 | |
| JP | H09233725 A | 9/1997 | |
| JP | 10136573 A | 5/1998 | |
| JP | 2000275282 A | 10/2000 | |
| JP | 2001286070 A | 10/2001 | |
| JP | 2002027758 A | 1/2002 | |
| JP | 2002262565 A | 9/2002 | |
| JP | 2005530468 A | 10/2005 | |
| JP | 2010011563 A | 1/2010 | |
| JP | 2012090480 A | 5/2012 | |
| JP | 2012249409 A | 12/2012 | |
| JP | 2012249410 A | 12/2012 | |
| JP | 2013198262 A | 9/2013 | |
| JP | 5454781 B2 | 3/2014 | |
| JP | 5822304 B2 | 11/2015 | |
| JP | 2016063622 A | 4/2016 | |
| TW | 200616305 A | 5/2006 | |
| TW | M481439 U | 7/2014 | |
| WO | 2008125790 A1 | 10/2008 | |
| WO | 2012167677 A1 | 12/2012 | |
| WO | 2015113341 A1 | 8/2015 | |
| WO | 2015113349 A1 | 8/2015 | |

OTHER PUBLICATIONS

Notice of acceptance for patent application issued in corresponding Australian application No. 2017215235 dated Mar. 22, 2019.

Liang-Rui Chen, "A Design of an Optimal Battery Pulse Charge System by Frequency-Varied Technique", IEEE Transactions on Industrial Electronics, vol. 54, No. 1, Feb. 2007, pp. 398-405.

Engllish translation of Office Action 1 issued in corresponding CN application No. 201680001814.4 dated Sep. 3, 2018.

English translation of Office Action 2 issued in corresponding CN application No. 201680001814.4 dated Apr. 17, 2019.

English translation of Office Action 1 issued in corresponding CN application No. 201780001423.7 dated Aug. 17, 2020.

English translation of Office Action 1 issued in corresponding CN application No. 201780001996.X dated Jun. 29, 2020.

Communication pursuant to Article 94(3) EPC issued in corresponding EP application No. 16819788.7 dated Mar. 5, 2020.

Communication pursuant to Article 94(3) EPC issued in corresponding EP application No. 17746704.0 dated Feb. 8, 2019.

Substantive Examination Report Stage I issued in corresponding ID application No. P00201700960.

Examination Report issued in corresponding IN application No. 201737001350 dated Mar. 12, 2019.

Examination Report issued in corresponding in application No. 201737046880 dated Jan. 22, 2019.

Notification of reasons for refusal issued in corresponding JP application No. 2017-514512 dated Sep. 4, 2018.

Notification of reasons for refusal issued in corresponding JP application No. 2018-504669 dated Oct. 16, 2018.

Notice of Allowance for Patent Registration issued in corresponding KR application No. 1020177002310 dated Aug. 24, 2018.

Examination Adverse Report issued in corresponding MY application No. PI2017700830 dated May 28, 2020.

Office Action issued in corresponding U.S. Appl. No. 15/406,017 dated Jun. 27, 2019.

Office Action issued in corresponding U.S. Appl. No. 15/406,017 dated Oct. 31, 2019.

Office Action issued in corresponding U.S. Appl. No. 15/406,017 dated Feb. 5, 2020.

Office Action issued in corresponding U.S. Appl. No. 15/563,594 dated Mar. 18, 2020.

Notice of Allowance and Fee(s) Due issued in corresponding U.S. Appl. No. 15/739,618 dated Feb. 7, 2020.

Notice of Allowance and Fee(s) Due issued in corresponding U.S. Appl. No. 15/739,618 dated Mar. 23, 2020.

Office Action issued in corresponding U.S. Appl. No. 15/406,017 dated Jun. 24, 2020.

Patent Rejection Decision issued in corresponding KR application No. 10-2017-7002310 dated Jun. 26, 2018.

Notice of allowance with English Translation issued in corresponding KR application No. 10-2018-7007677 dated Dec. 23, 2020.

* cited by examiner

ADAPTER AND METHOD OF CONTROLLING CHARGING PROCESS

CROSS REFERENCE TO RELATED APPLICATION

This application is a US national phase application based upon an International Application No. PCT/CN2017/070517, filed on Jan. 7, 2017, which claims priority to International Application No. PCT/CN2016/073679, filed on Feb. 5, 2016 and Chinese Application No. 201610600612.3 filed on Jul. 26, 201.6. The entire disclosures of the above applications are incorporated herein by reference.

BACKGROUND

1. Field of Disclosure

The present disclosure relates to the field of charging, and more particularly, to an adapter and a method of controlling a charging process.

2. Description of Related Art

Adapters are also known as power adapters, which are used for charging chargeable devices (such as terminals). Currently, existing adapters typically charges chargeable devices in a constant voltage mode. Since batteries of devices to be charged are mostly lithium batteries, charging the batteries with the constant voltage is likely to cause lithium precipitation, resulting in reduced battery life.

SUMMARY

The present disclosure provides an adapter and a method of controlling a charging process, in order to reduce the lithium precipitation of lithium batteries, and improve battery life.

According to a first aspect of the present disclosure, an adapter supporting a first charging mode and a second charging mode is provided. The adapter includes a power converting circuit and a control circuit. The power converting circuit is configured to convert inputted alternating current (AC) to generate output voltage and output current of the adapter, the power converting circuit comprising a secondary filter circuit. The control circuit is coupled to the secondary filter circuit and configured to control the secondary filter circuit to operate when the adapter operates in the first charging mode, so that the adapter outputs constant direct current, and configured to control the secondary filter circuit not to operate when the adapter operates in the second charging mode, so that the adapter outputs an alternating current or a pulsating direct current.

According to a second aspect of the present disclosure, a method of controlling a charging process performed by an adapter is provided. The adapter includes a power converting circuit configured to convert inputted alternating current (AC) to generate output voltage and output current. The power converting circuit includes a secondary filter circuit. The method includes the following operation. The secondary filter circuit is controlled to operate when the adapter operates in a first charging mode, so that the adapter outputs constant direct current. The secondary filter circuit does not operate when the adapter operates in a second charging mode, so that the adapter outputs an alternating current or a pulsating direct current.

The adapter of the embodiment of the present disclosure, when outputting alternating current (AC) or pulsating direct current, can reduce the lithium precipitation, the probability and strength of the arc of the contact of the charging interface, and improve the lifespan of the charging interface. In addition, the adapter of the present disclosure can switch flexibly between different charging modes.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

DESCRIPTION OF THE EMBODIMENTS

To help a person skilled in the art better understand the solutions of the present disclosure, the following clearly and completely describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present disclosure.

The present disclosure proposes a first adapter for charging a chargeable device (e.g. a terminal) in the relevant technology. The first adapter constantly maintains an output voltage when the first adapter operates in a constant voltage mode, such as 5V, 9V, 12V or 20V, etc.

Voltage output from the first adapter is not suitable to be directly applied to a positive terminal and a negative terminal of a battery. Rather, the voltage output from the first adapter needs to be first converted through a converter circuit in a chargeable device (terminal) so as to obtain an expected charging voltage and/or a charging current by a battery in the chargeable device (terminal).

The converter circuit is configured to convert the voltage output from the first adapter so as to satisfy the expected requirement of the charging voltage and/or the charging current by the battery.

As an example, the converter circuit may refer to a charging management module, such as a charging integrated circuit (IC), which is configured to manage the charging voltage and/or the charging circuit of the battery during the charging process of the battery. The converter circuit has a function of a voltage feedback module and/or a function of a current feedback module to manage the charging voltage and/or the charging circuit of the battery.

For example, the charging process of the battery may include at least one of a trickle charging stage, a constant current charging stage, and a constant voltage charging stage. During the trickle charging stage, the converter circuit can utilize a current feedback loop so that a current entering into the battery satisfies a magnitude of the charging current expected by the battery (such as a first charging current) in the trickle charging stage. During the constant current charging stage, the converter circuit can utilize the current feedback loop so that the current entering into the battery satisfies magnitude of the charging current expected by the battery (such as a second charging current, the second charging current may be greater than the first charging current) in the constant current charging stage. During the constant voltage charging stage, the converter circuit can utilize a voltage feedback loop so that a voltage applied between a positive terminal and a negative terminal of the battery satisfies a magnitude of the charging voltage expected by the battery in the constant voltage charging stage.

As an example, when the voltage output from the first adapter is greater than the charging voltage expected by the battery, the converter circuit can be configured to step down the voltage output from the first adapter so that the charging voltage obtained after buck conversion satisfies the charging voltage expected by the battery. As another example, when the voltage output from the first adapter is less than the charging voltage expected by the battery, the converter circuit can be configured to boost the voltage output from the first adapter so that the charging voltage obtained after the boost conversion satisfies the charging voltage expected by the battery.

In yet another example, a constant 5V voltage output from the first adapter is taken as an example. When the battery includes a single cell (take a lithium battery cell for example, a charging cut-off voltage of a single cell is 4.2V), the converter circuit (such as a buck circuit) can step down the voltage output from the first adapter so that the charging voltage obtained after bucking satisfies the charging voltage expected by the battery.

In yet another example, the constant voltage of 5V output from the first adapter is taken as an example. When the battery is a battery having two or more than two cells (take the lithium battery cell for example, the charging cut-off voltage of the single cell is 4.2V) coupled in series, the converter circuit (such as a boost circuit) can boost the voltage output from the first adapter so that the charging voltage obtained after boosting satisfies the charging voltage expected by the battery.

Because the converter circuit is limited by low conversion efficiency of the circuit, electrical energy that is not converted, is dissipated in a form of heat. This heat will accumulate inside the chargeable device (terminal) (such as the terminal), where a design space and a heat dissipation space of the chargeable device (terminal) (such as the terminal) are both limited (for example, a physical size of a mobile terminal used by a user becomes increasingly thin and light, and a great number of electronic components are closely arranged inside the mobile terminal to enhance performance of the mobile terminal). Not only does it create increased difficulty of designing the converter circuit, but also it is very difficult to dissipate heat accumulated inside the chargeable device (terminal) (such as the terminal) in a timely manner, thus causing the chargeable device (terminal) (such as the terminal) to become abnormal.

For example, heat accumulated by the converter circuit is likely to cause thermal interference with electronic components near the converter circuit so that the electronic components work abnormally; and/or, for example, the heat accumulated on the converter circuit is likely to shorten service lives of the converter circuit and the electronic components nearby; and/or, for example, the heat accumulated on the converter circuit is likely to cause thermal interference with the battery so that the battery charges and discharges abnormally; and/or, for example, the heat accumulated on the converter circuit is likely to raise temperature of the chargeable device (terminal) (such as the terminal) so that the user experience is affected when the user charges; and/or, for example, the heat accumulated on the converter circuit is likely to cause a short circuit of the converter circuit itself so that the battery charges abnormally when the voltage output from the first adapter is directly applied between the positive terminal and negative terminal of a battery. Under the circumstances that the battery is over charged for a long time, the battery can even explode, which in turn causes a certain security concern.

The present disclosure provides a second adapter capable of adjusting output voltage. The second adapter according to the embodiment of the present disclosure can acquire battery state information. The battery state information at least includes a current battery level information and/or voltage information. The second adapter adjusts an output voltage of the second adapter itself based on the acquired battery state information to satisfy a charging voltage and/or a charging current expected by the battery. A voltage output from the second adapter after adjustment can be directly applied between the positive terminal and negative terminal of the battery to charge the battery (hereinafter referred to as "direct charge"). Furthermore, adjusted voltage outputted by the second adapter can directly apply a positive terminal and a negative terminal of a battery to charge the battery during a process of charging the battery under the constant current charging stage.

The second adapter has functions of a voltage feedback module and a current feedback module, to achieve the closed-loop feedback control of the charging voltage and/or the charging circuit of the battery.

In some embodiments, the second adapter adjusting the output voltage of the second adapter itself based on the acquired battery state information may refer to the second adapter can acquire the battery state information in a real-time manner and adjust the voltage output from the second adapter itself based on real-time state information of the battery acquired every time, to satisfy the charging voltage and/or the charging current expected by the battery.

In some embodiments, the second adapter adjusting the output voltage of the second adapter itself based on the battery state information acquired in a real-time manner may refer to the second adapter can acquire current state information of the battery at different times during a charging process as the charging voltage of the battery continues to rise during the charging process, and adjust the output voltage of the second adapter itself based on the current state information of the battery in a real-time manner to satisfy the charging voltage and/or the charging current expected by the battery.

For example, the charging process of the battery may include at least one of a trickle charging stage, a constant current charging stage, and a constant voltage charging stage. During the trickle charging stage, the second adapter can output a first charging current to charge the battery so as to satisfy the charging current expected by the battery (e.g. a first charging current). During the constant current charging stage, the second adapter can utilize a current feedback loop so that a current output from the second adapter and enters into the battery satisfies the charging current expected by the battery (for example, a second charging current greater than the first charging current). During the constant current charging stage, the second adapter output charging voltage onto the battery to charge the battery. During the constant voltage charging stage, the second adapter can utilize a voltage feedback loop so that a voltage output from the second adapter to the chargeable device (terminal) in the constant voltage charging stage is maintained constantly.

During the trickle current charging stage and the constant voltage charging stage, the second adapter can utilize a converter of the chargeable device (terminal) to output charge voltage/current as expected.

Figure 1:
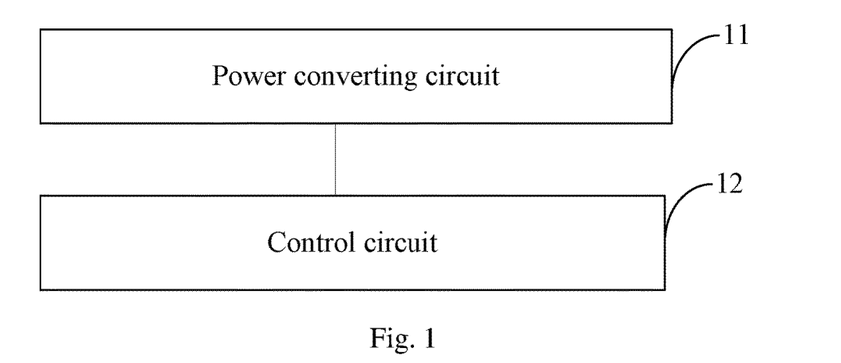
FIG. 1 illustrates a schematic diagram of a second adapter according to one embodiment of the present disclosure.

FIG. 1 is a schematic diagram of a second adapter according to an embodiment of the present disclosure. The second adapter 10 includes a power converting circuit 11 and a control circuit 12.

The power converting circuit 11 is configured to convert an input alternating current into output voltage and output current of the second adapter 10. The power converting circuit 11 includes a secondary filter circuit.

The control circuit 12 is coupled to the secondary filter circuit. When the second adapter 10 operates in a first charging mode, the control circuit 12 controls the secondary filter circuit to operate, so that the second adapter 10 outputs a constant direct current. When the second adapter operates in a second charging mode, the control circuit 12 controls the secondary filter circuit not to operate, so that the second adapter outputs an alternating current or pulsating direct current.

Alternatively, in some embodiments, the first charging mode may be a constant voltage mode.

Alternatively, in some embodiments, the second charging mode may be a constant current mode.

The second adapter of the embodiment of the present disclosure, when outputting AC or pulsating direct current to charge the battery, can reduce the lithium precipitation, probability and strength of the arc of the contact of the charging interface, and improve the lifespan of the charging interface. In addition, the second adapter of the embodiment of the present disclosure can switch between different charging modes flexibly.

Figure 2A:
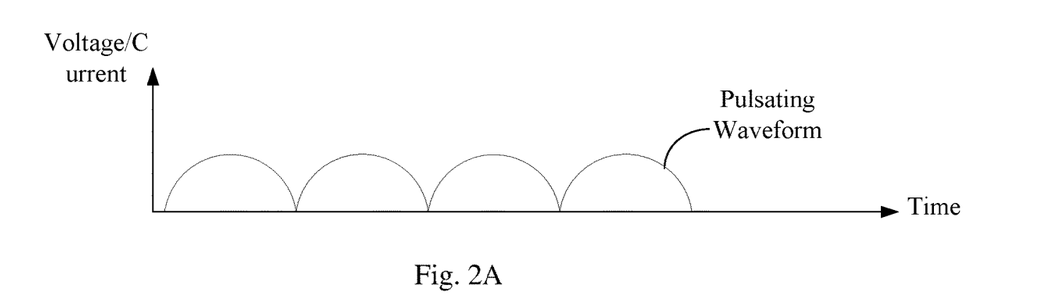
FIGS. 2A and 2B illustrate pulsating waveforms according to one embodiment of the present disclosure.
Figure 2B:
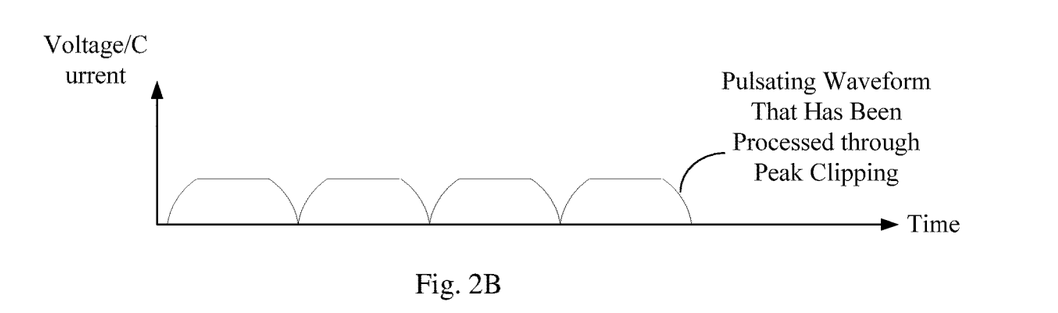

As mentioned above, the second the adapter operable in the second charging mode can output AC or pulsating direct current, i.e. current with pulsating waveform. The pulsating waveform refers to a complete pulsating waveform, or a clipped pulsation waveform after clipping the complete pulsation waveform. The clipping may refer to filtering a portion of the pulsating waveform that exceeds a threshold, to control the peak value of the pulsating waveform. The embodiment in FIG. 2 illustrates a complete pulsating waveform. The embodiment in FIG. 2B illustrates the clipped pulsation waveform.

It should be understood that when the second adapter 10 operates in a first charging mode, the secondary filter circuit is operating normally. Current coupling from a primary side to a secondary side of the power converting circuit 11, after being rectified, must be filtered by the secondary filter circuit to output a constant direct current (i.e. a current with a steady current value). When the second adapter 10 is operating in the second charging mode, the secondary filter circuit stops operating. In some embodiments, the current coupling from the primary side to the secondary side of the power converting circuit 11 can be outputted directly or outputted after some simple processing. The output current of the second adapter 10 now may be an alternating current. In some other embodiments, the current coupling from the primary side to the secondary side of the power converting circuit 11 may be rectified, and the rectified current is outputted after some simple processing. The output current of the second adapter 10 now is a pulsating direct current.

The second adapter 10 of the embodiment of the present disclosure can charge the chargeable device (terminal). The chargeable device (terminal) in the embodiment of the present disclosure may be a "communication terminal" (or simply "terminal"), including but not limited to a device a device configured to be coupled via a wired connection (for example, via a public switched telephone network (PSTN), a digital subscriber line (DSL), a digital cable, a direct cable connection, and/or another data connection/network) and/or a device configured to receive/send a communication signal via a wireless interface (such as a cellular network, a wireless local area network (WLAN), a digital television network such as a DVB-H network, a satellite network, an AM-FM broadcast transmitter, and/or another communication terminal). A terminal configured to communicate via a wireless interface may be referred to as a "wireless communication terminal", a "wireless terminal", and/or a "mobile terminal". Examples of mobile terminal include, but are not limited to, a satellite or cell phone; a personal communication system (PCS) terminal that can combine a cellular radiotelephone, data processing, facsimile, and data communications capabilities; may include a radiotelephone, a pager, an Internet/Intranet access, a Web browser, an electronic organizer, a calendar, and/or a personal digital assistant (PDA) equipped with a global positioning System (GPS) receiver; and a common laptop and/or palm type receiver or some other electronic devices including a transmitter-receiver of a radiotelephone.

In some embodiments, the second adapter 10 may include a charging interface. However, the embodiment of the present disclosure does not impose any specific limits on the type of the charging interface. For example, it may be a universal serial bus (USB) interface, which can be a standard USB interface, a micro USB port, or a Type-C interface.

In some embodiments, the control circuit 12 may also control the charging process to enhance the smartness of the second adapter. Specifically, the control circuit 12 can be applied to the chargeable device (terminal) for a bidirectional communication, to extract commands or state communication of the chargeable device (terminal) (e.g. the current voltage and temperature of the chargeable device (terminal)), which can be the basis to control the charging process of the second adapter. Furthermore, in some embodiments, the control circuit 12 may be a microcontroller unit (MCU), but the embodiment of the present disclosure does not impose a limit on this regard. The control circuit 12 may also be other types of chips or circuits.

Alternatively, in some embodiments, the capacitor of the secondary filter circuit is a solid capacitor. It should be understood that the number of the solid capacitors may be one or more.

Figure 3:
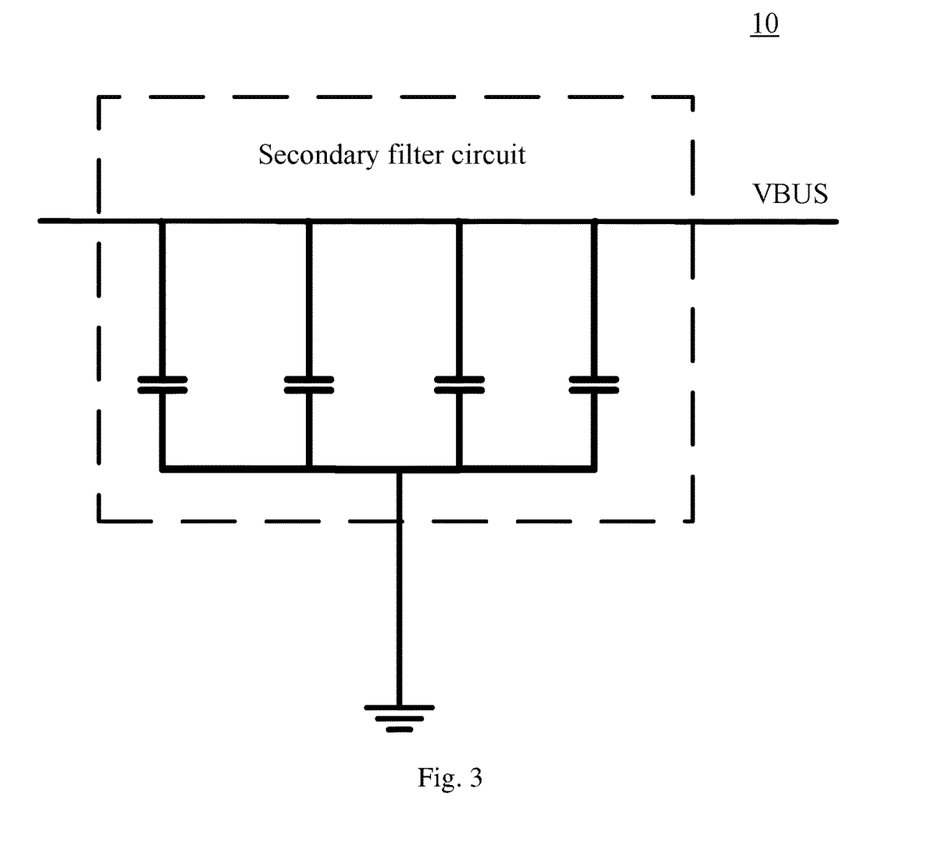
FIG. 3 illustrates a block schematic diagram of a second adapter according to another embodiment of the present disclosure.

Furthermore, the secondary filter circuit may include a plurality of solid capacitors, which can be coupled to a secondary bus line of the second adapter or round line. Take FIG. 3 as an example. The secondary filter circuit may include four solid capacitors, coupled in parallel. It should be understood that the secondary filter circuit in FIG. 3 is just a specific example, and the number of solid capacitors of the secondary filter circuit may vary. The embodiment of the present disclosure does not impose a limit here. In the case where the total number of the capacitors in the secondary filter circuit is constant, applying a plurality of small capacitors coupled in parallel can effectively reduce the equivalent resistance and the equivalent inductance of the capacitor, so that the direct current outputted by the secondary filter circuit is more stable.

Furthermore, the capacitance or number of the capacitors can be confirmed depending on a maximum current allowed to be outputted by the second adapter operable in the first charging mode. In the first charging mode, a need to boost the maximum current allowed to be outputted by the second adapter can be met by increasing the capacitance and/or number of capacitors in the secondary filter circuit.

Alternatively, in some embodiments, the VBUS terminal of the second adapter may also be coupled to a number of ceramic capacitors to filter some ripples in the output voltage and output current of the second adapter.

Figure 4:
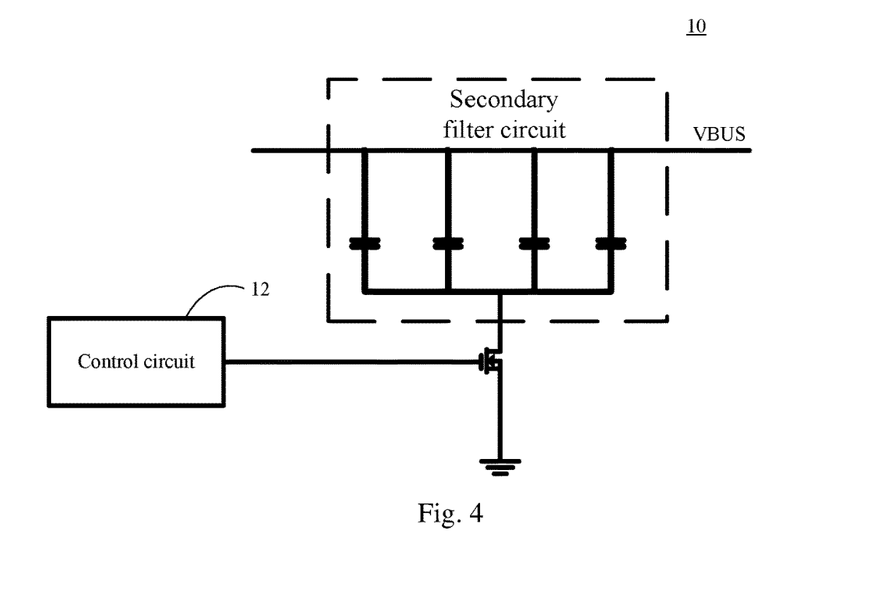
FIG. 4 illustrates a block schematic diagram of a second adapter according to still another embodiment of the present disclosure.

As illustrated in FIG. 4, the control circuit 12 can be coupled to the second filter circuit through a metal oxide semiconductor (MOS) transistor. In FIG. 4, a gate of the MOS transistor is coupled to the control circuit 12, a source of the MOS transistor is grounded, and a drain of the MOS transistor is coupled to an end of the capacitor in the secondary filter circuit. The control circuit 12 may control the on and off of the MOS transistor via a pulse-width-modulation (PWM) signal. For example, when the PWM signal is at a high level, the source and the drain of the MOS transistor is conducted, and the secondary filter circuit is in working mode. When the PWM signal is at a low level, the source and the drain of the MOS transistor is not conducted, and the secondary filter circuit is a stop mode.

It should be understood that the control circuit 12 an control the on and off of the MOS transistor via other types of signals other than the PWM signal. The abovementioned MOS transistor can be a N-channel enhancement type MOS transistor, or other types of MOS transistors. Furthermore, the control circuit 12 may also adopt other components that functions as a switch to control the operation of the secondary filter circuit. The embodiment of the present disclosure does not impose a limit on this regard.

Alternatively, in some embodiments, the second adapter 10 may support the first charging mode and the second charging mode. The adapter operable in the second charging mode charges the chargeable device (terminal) faster than the adapter operable in the first charging mode charges the chargeable device (terminal). In other words, it takes less time for the adapter to charge the battery with the same electricity volume under the second charging mode compared with the adapter under the first charging mode.

The second adapter 10 includes a control circuit. In the process when the second adapter 10 is coupled to the chargeable device (terminal), the control circuit undertakes the bidirectional communication with the chargeable device (terminal), to control the charging process of the second charging mode. The control circuit may be a control circuit in any of the abovementioned embodiments, such as a control circuit in a first adjustment circuit or a control circuit in a second adjustment circuit.

The first charging mode may be a normal charging mode. The second charging mode may be a fast charging mode. The normal charging mode means that the second adapter outputs a comparably smaller amount of current (usually less than 2.5 A) or a comparably smaller amount of power (usually less than 15 W) to charge a battery in the chargeable device (terminal). It usually takes several hours to fill up a battery with a larger amount (like with an amount of 3000 milliampere) on the normal charging mode. The adapter outputs a comparably larger amount of current (usually greater than 2.5 A, like 4.5 A, 5 A, or more) or a comparably larger amount of power (usually more than or equal to 15 W) to charge the battery in the chargeable device (terminal) by the fast charging mode. Compared with the normal charging mode, the charging rate of the second adapter is faster on the fast charging mode so it takes less time to full up a battery with the same volume obviously.

The embodiment of the present disclosure does not impose specific limits on the communicated content between the control circuit of the second adapter and the chargeable device (terminal), and the control method adopted by the control circuit when controlling the second adapter operable in the second charging mode. For example, the control circuit can communicate with the chargeable device (terminal), extract information about the present voltage or current of the battery in the chargeable device (terminal), and adopt the output voltage or current of the second adapter accordingly. The following text describes in detail the control method of the control circuit when controlling the second adapter operable in the second charging mode.

Alternatively, in some embodiments, the control circuit undertakes a bidirectional communication with the chargeable device (terminal), to control the output process of the second adapter operable in the second charging mode. The process may include the bidirectional communication between the control circuit and the chargeable device (terminal) to negotiate a charging mode which the chargeable device and the second adapter are operable in (terminal).

In the embodiment of the present disclosure, the second adapter does not always adopt the second charging mode to charge the chargeable device (terminal), but engage in the bidirectional communication with the chargeable device (terminal) to negotiate whether the second adapter may employ the second charging mode on the chargeable device (terminal) for fast charging. It can enhance the safety of the charging process.

Specifically, the control circuit undertakes the bidirectional communication with the chargeable device (terminal), to negotiate the charging mode between the second adapter and the chargeable device (terminal). The process can include the control circuit sending to the chargeable device (terminal) a first instruction, which is configured to inquire the chargeable device (terminal) whether to enable the second charging mode. The control circuit receives a reply instruction responsive to the first instruction sent by the chargeable device (terminal). The reply instruction is configured to show whether the chargeable device (terminal) approves to enable the second charging mode. If the chargeable device (terminal) approved to enable the second charging mode, the control circuit will charge the chargeable device (terminal) in the second charging mode.

The foregoing description of the embodiment of the present disclosure does not impose limits on the master/ slave relationship between the second adapter (or the control circuit of the second adapter) and the chargeable device (terminal). In other words, either the control circuit or the chargeable device (terminal) can be the master side and initiate the bidirectional communication. Correspondingly, the other side can serve as the slave side to generate a first response or first reply in practice, the decision of which device should be the master or slave can be made by comparing the levels of the second adapter and the chargeable device (terminal) relative to the earth during the communication process.

The embodiment of the present disclosure does not impose limits on the specific implementation of the bidirectional communication between the second adapter (or the control circuit of the second adapter) and the chargeable device (terminal). In other words, either the second adapter (or the control circuit of the second adapter) or the chargeable device (terminal) can be the master device to initiate the communication. Correspondingly, the other side can serve as the slave device to generate a first response or first reply in the communication initiated by the master device. Meanwhile, if the master device can generate a second response towards the first response or first reply of the slave device, it is considered that a negotiation process on charging mode has been completed between the master and slave devices. In practice, the charging operation can take place after the master and slave devices have completed several rounds of negotiation on the charging mode to ensure that the charging process after the negotiation is safe and reliably executed.

One of the methods that the master device may adopt to generate the second response towards the first response or first reply generated by the slave device specifically for the communication may be: the master device can receive the first response or first reply generated by the slave device specifically for the communication, and make a second response specifically towards the first response or first reply generated by the slave device. For example, when the master device receives a first response or first reply generated by the slave device specifically for the communication within a designated period of time, the master device generates the specific second response towards the first response or first reply generated by the slave device. More specifically, when the master device and the slave device completes a round of negotiation on the charging mode, the master device and the slave device perform the first charging mode or the second charging mode in accordance with the negotiation result. That is, the second adapter charges the chargeable device (terminal) in the first charging mode or the second charging mode according to the negotiation result.

Another method that the master device may adopt to generate the second response towards the first response or first reply generated by the slave device specifically for the communication may be: the master device does not receive the first response or first reply generated by the slave device specifically for the communication within the designated period of time, but the master device still generates the specific second response towards the first response or first reply generated by the slave device specifically for the communication. For example, when the master device does not receive the first response or first reply generated by the slave device specifically for the communication within the designated period of time, the master device still generates the specific second response towards the first response or first reply generated by the slave device. More specifically, the master device and slave device complete a round of negotiation on the charging mode, and the master device and slave device will perform the charging operation in the first charging mode, meaning that the second adapter charges the chargeable device (terminal) in the first charging mode.

Alternatively, in some embodiments, when the chargeable device (terminal) serve as the master device to initiate the communication, the second adapter (or the control circuit of the second adapter) generates a first response or first reply specifically for the communication initiated by the master device. Then, a round of negotiation on the charging mode is considered completed between the second adapter (or the control circuit of the second adapter) and the chargeable device (terminal), and there is no need to wait for a specific second response generated by the chargeable device (terminal) towards the first response or first reply of the second adapter. Therefore, the second adapter can decide to charge the chargeable device (terminal) in the first charging mode or the second charging mode according to the negotiation result.

Alternatively, in some embodiments, the control circuit and the chargeable device (terminal) engage in the bidirectional communication, to control the output of the second adapter operable in the second charging mode. The process may include: the control circuit and the chargeable device (terminal) engage in the bidirectional communication to determine the charging voltage for the chargeable device (terminal) outputted by the second adapter operable in the second charging mode; the control circuit adjusts the output voltage of the second adapter so that it (or the peak value of the output voltage of the second adapter) is equal to the charging voltage for the chargeable device (terminal) outputted by the second adapter operable in the second charging mode.

Specifically, the control circuit and the chargeable device (terminal) engage in the bidirectional communication, to determine the charging voltage for the chargeable device (terminal) outputted by the second adapter operable in the second charging mode. The process may include: the control circuit sends to the chargeable device (terminal) a second instruction which is configured to inquire whether the output voltage of the second adapter matches the present voltage of the battery in the chargeable device (terminal). The control circuit receives a reply instruction responsive to the second instruction sent by the chargeable device (terminal), which is configured to show whether the output voltage of the second adapter matches, or is higher or lower than, the present voltage of the battery. Alternatively, the second instruction can be configured to inquire whether it is appropriate to utilize the present output voltage of the second adapter as the charging voltage to be outputted by the second adapter for the chargeable device (terminal) in the second charging mode. The reply instruction responsive to the second instruction can be configured to show whether the present output voltage of the second adapter is appropriate, or higher or lower. When the present voltage of the second adapter matches the present voltage of the battery, or when it is appropriate to be used as the charging voltage to be outputted by the second adapter for the chargeable device (terminal) in the second charging mode, it may mean that the present output voltage of the second adapter (or the peak value of the present output voltage) is slightly higher than the present voltage of the battery, and the gap between the output voltage of the second adapter (or the peak value of the present output voltage) and the present voltage of the battery is within a predetermined range (typically within a few hundred millivolts).

Alternatively, in some embodiments, the control circuit and the chargeable device (terminal) engage in the bidirectional communication to control the charging process outputted by the second adapter in a second charging mode. The process may include: the control circuit and the chargeable device (terminal) engage in a bidirectional communication to determine a charging current outputted by the second adapter for the chargeable device (terminal) in the second charging mode. The control circuit adjusts the output current of the second adapter (or the peak value of the output current of the second adapter), so that the output current of the second adapter (or the peak value of the output current of the second adapter) is equal to the charging current outputted by the second adapter for the chargeable device (terminal) in the second charging mode.

Specifically, the control circuit and the chargeable device (terminal) engage in the bidirectional communication to determine the charging current outputted by the second adapter for the chargeable device (terminal) in the second charging mode. The process may include: the control circuit sends to the chargeable device (terminal) a third instruction, which is configured to inquire the present maximum charging current supported by the chargeable device (terminal). The control circuit receives a reply instruction responsive to the third instruction, which is configured to show the present maximum charging current supported by the chargeable device (terminal). The control circuit determines the charging current outputted by the second adapter for the chargeable device (terminal) by the second charging mode based on the present maximum charging current supported by the chargeable device (terminal). It should be understood the control circuit can apply many methods to determine the charging current outputted by the second adapter for the chargeable device (terminal) by the second charging mode based on the present maximum charging current supported by the chargeable device (terminal). For example, the second adapter can determine the present maximum charging current supported by the chargeable device (terminal) as the charging current (or the peak value of the charging current) outputted by the second adapter for the chargeable device (terminal) in the second charging mode. Another method is to deter mine the charging current outputted by the second adapter for the chargeable device (terminal) by the second charging mode after taking into consideration the present maximum charging current supported by the chargeable device (terminal), the capacity to output current and other factors.

Alternatively, in some embodiments, the control circuit and the chargeable device (terminal) engage in bidirectional communication to control the output of the second adapter operable in the second charging mode. The process may include: the control circuit and the chargeable device (terminal) engage in a bidirectional communication while the second adapter is charging the chargeable device (terminal) in the second charging mode, to adjust the output current of the second adapter.

Specifically, the control circuit and the chargeable device (terminal) engage in bidirectional communication to adjust the output current of the second adapter may include: the control circuit sends to the chargeable device (terminal) a fourth instruction, which is configured to inquire the present voltage of battery in the chargeable device (terminal). The control circuit receives a reply instruction responsive to the fourth instruction sent by the second adapter, which is configured to show the present voltage of the battery. The control circuit adjusts the output current of the second adapter according to the present voltage of the battery.

Figure 5A:
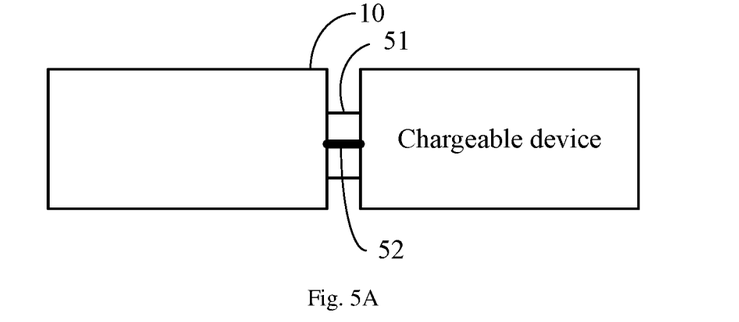
FIG. 5A illustrates a connection between a chargeable device and a second adapter according to one embodiment of the present disclosure.

Alternatively, in some embodiments, as illustrated in FIG. 5A, the second adapter 10 includes a charging interface 51. Furthermore, in some embodiments, the control circuit of the second adapter 10 can engage in the bidirectional communication with the chargeable device (terminal) through a data line 52 of the charging interface 51.

Alternatively, in some embodiments, the control circuit and the chargeable device (terminal) engage in the bidirectional communication to control the output of the second adapter operable in the second charging mode. The process may include: the control circuit and the chargeable device (terminal) engage in the bidirectional communication to confirm whether the charging interface is poorly coupled.

Specifically, the control circuit and the chargeable device (terminal) engage in the bidirectional communication to confirm whether the charging interface is poorly coupled. The process may include: the control circuit sends to the chargeable device (terminal) the fourth instruction, which is configured to inquire the present voltage of the battery of the chargeable device (terminal). The control circuit receives a reply instruction responsive to the fourth instruction sent by the chargeable device (terminal), which is configured to show the present voltage of the battery in the chargeable device (terminal). The control circuit confirms whether the charging interface is poorly coupled according to the output voltage of the second adapter and the present voltage of the battery in the chargeable device (terminal). For example, when the control circuit confirms that the gap between the output voltage of the second adapter and the present voltage of the battery of the chargeable device (terminal) is larger than a predetermined voltage threshold, it means that the impedance resulted from diving the voltage gap by the present current outputted by the second adapter is larger than the predetermined impedance threshold, thus it is confirmed that the charging interface is poorly coupled.

Alternatively, in some embodiments, whether the charging interface is poorly coupled can be confirmed by the chargeable device (terminal). The process may include: the chargeable device (terminal) sends to the control circuit a sixth instruction, which is configured to inquire the output voltage of the second adapter. The chargeable device (terminal) receives a reply instruction responsive to the sixth instruction sent by the control circuit, which is configured to show the output voltage of the second adapter. The chargeable device (terminal) confirms whether the charging interface is poorly coupled based on the present voltage of the battery of the chargeable device (terminal) and the output voltage of the second adapter. After the chargeable device (terming) confirms that the charging interface is poorly coupled, the chargeable device (terminal) sends a fifth instruction to the control circuit, which is configured to show that the charging interface is poorly coupled. The control circuit can control the second adapter to exit the second charging mode after receiving the fifth instruction.

Figure 5B:
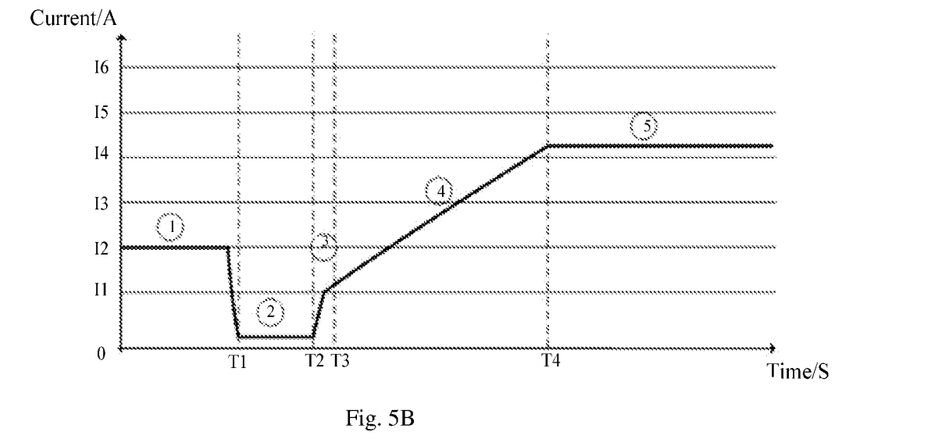
FIG. 5B illustrates a timing diagram of a fast charging process according to one embodiment of the present disclosure.

Accompanied by FIG. 5B, the present embodiment details a communication process between the control circuit of the second adapter and the chargeable device (terminal). It is understood that the example illustrated in FIG. 5B merely help a person skilled in the art understand the present embodiment rather than limit the number of scenes. A person skilled in the art can modify or change the embodiment correspondingly according to the example illustrated in FIG. 5B. Such modifications or changes are within the scope of the present embodiment.

As illustrated in FIG. 5B, the communication process between the second adapter and the chargeable device (terminal) may include Stage 1, Stage 2, Stage 3, Stage 4, and Stage 5.

Stage 1:

After the chargeable device (terminal) and a power supply device are coupled, the chargeable device (terminal) may detect the type of power supply device via data lines D+ and D−. When the chargeable device (terminal) detects the power supply device to be the second adapter, the current absorbed by the chargeable device terminal) is greater than the predetermined current threshold I2 (such as 1 A). When the second adapter detects the current outputted by the second adapter greater than or equal to the predetermined current threshold I2 within the predetermined duration (for example, a continuous T1 duration), the second adapter may regard the type of the power supply device is recognized by the chargeable device (terminal). Afterwards, the second adapter starts to negotiate with the chargeable device (terminal) and sends instruction 1 (corresponding to the above-mentioned first instruction) to the chargeable device (terminal) to inquire whether the chargeable device (terminal) agrees the second adapter to charge the chargeable device (terminal) by the second charging mode.

When the second adapter receives the reply instruction responsive to instruction 1 sent by the chargeable device (terminal), and the reply instruction responsive to Instruction 1 instructions the chargeable device (terminal) to not agree the second adapter to charge the chargeable device (terminal) by the second charging mode, the second adapter detects the output current of the second adapter again. When the current outputted by the second adapter is still greater than or equal to I2 in a predetermined continuous duration (for example, a continuous T1 duration), the second adapter sends the reply instruction responsive to instruction 1 to the chargeable device (terminal) again. The second adapter inquires the chargeable device (terminal) to agree to charge the chargeable device (terminal) with the second adapter on the second mode. The second adapter repeats the operation at Stage 1 until the chargeable device (terminal) agrees the second adapter to charge the chargeable device (terminal) on the second mode or the current outputted by the second adapter no longer satisfies the requirement of the output current greater than or equal to I2.

When the chargeable device (terminal) agrees the second adapter to charge the chargeable device (terminal) by the second charging mode, the communication process enters Stage 2.

Stage 2:

The voltage outputted by the second adapter may include a plurality of levels. The second adapter sends instruction 2 to the chargeable device (terminal) (corresponding to the second instruction) to inquire whether the voltage outputted by the second adapter (the present output voltage) matches the present total voltage of the chargeable device (terminal).

The chargeable device (terminal) sends the reply instruction responsive to Instruction 2 to command the voltage outputted by the second adapter to match the present total voltage of the chargeable device (terminal) or to make the voltage outputted by the second adapter and the present total voltage of the chargeable device (terminal) higher or lower. If the reply instruction responsive to Instruction 2 is to make the voltage outputted by the second adapter and the present total voltage of the chargeable device (terminal) higher or lower, the second adapter can adjust one level of the voltage outputted by the second adapter and sends the reply instruction responsive to Instruction 2 to the chargeable device (terminal) to inquire whether the voltage outputted by the second adapter matches the present voltage of the battery again. The operation at Stage 2 are repeated until the chargeable device (terminal) ensures that the voltage outputted by the second adapter matches the present voltage of the battery. Afterwards, Stage 3 starts.

Stage 3:

The second adapter sends Instruction 3 (corresponding to the above-mentioned the third instruction) and inquires the maximum charging current supported by the chargeable device (terminal) currently. The chargeable device (terminal) sends the reply instruction responsive to Instruction 3 to the second adapter to command the maximum charging current supported by the chargeable device (terminal) currently. Afterwards, Stage 4 starts.

Stage 4:

Based on the maximum charging current supported by the chargeable device (terminal) currently, the charging current outputted by the second adapter to charge the chargeable device (terminal) under the second charging mode. Afterwards, Stage 5 starts, that is, constant current charging stage.

Stage 5:

When entering the constant current charging stage, the second adapter sends Instruction 4 (corresponding to the above-mentioned fourth instruction) to the chargeable device (terminal) every interval of time and inquire the present voltage of the battery of the chargeable device (terminal). The chargeable device (terminal) sends the reply instruction responsive to Instruction 4 to the second adapter to feedback the present voltage of the battery. The second adapter can detect whether the connection of the charging interface is normal based on the present voltage of the battery and whether the current outputted by the second adapter needs lower. When the connection of the charging interface is poor, the chargeable device (terminal) sends Instruction 5 (corresponding to the above-mentioned fifth instruction), the second adapter retreats from the second charging mode, resets to enter Stage 1.

Optionally, to serve as one embodiment, the chargeable device (terminal) sends a reply instruction responsive to Instruction 1 at Stage 1. The reply instruction responsive to Instruction 1 may attach data (or information) of a path impedance of the chargeable device (terminal). The connection of the charging interface is detected to be normal with the path impedance of the chargeable device (terminal) at Stage 5.

Optionally, to serve as one embodiment, a time period, from the time that the chargeable device (terminal) agrees the second adapter charging the chargeable device (terminal) by the second charging mode until the time that an output voltage of the second adapter is adjusted to a suitable charging voltage, may be set as a predetermined time period at Stage 2. If the time goes beyond the predetermined time period, the second adapter or the chargeable device (terminal) is detected to be abnormal in the communication process and then resets to enter Stage 1.

Optionally, to serve as one embodiment, the voltage outputted by the second adapter is higher than the present voltage of the battery of the chargeable device (terminal) by ΔV (ΔV can range from 200 mV to 500 my) at Stage 2. The chargeable device (terminal) may send a reply instruction responsive to Instruction 2 to the second adapter to command the voltage outputted by the second adapter to match the voltage of the battery of the chargeable device (terminal).

Optionally, to serve as one embodiment, the adjustment speed of a current outputted by the second adapter can be controlled within limits at Stage 4. In this way, the charging process will not be abnormal once the adjustment speed is too high.

Optionally, to serve as one embodiment, a variation of a current outputted by the second adapter is controlled within five percent (5%) of the output current at Stage 5.

Optionally, to serve as one embodiment, the control circuit can detect a path impedance of a charging circuit in real time at Stage 5. Specifically, the control circuit can detect the path impedance of the charging circuit based on an output voltage and an output current of the second adapter and the present voltage (present total voltage of the multiple cells) of the battery feedback by the chargeable device (terminal). Since "path impedance of charging circuit" greater than "path impedance of charging circuit plus impedance of charging cable" indicates a bad contact of a charging interface, the second adapter stops charging the chargeable device (terminal) under the second charging mode.

Optionally, to serve as one embodiment, after the second adapter starts to charge the chargeable device (terminal) under the second charging mode, communication interval between the control circuit and the chargeable device (terminal) is controlled within limits to prevent abnormality from occurring in the communication process because the interval is too short.

Optionally, to serve as one embodiment, termination of the charging process (or termination of the charging process of the second adapter to a chargeable device (terminal) under the second mode) may be divided into recoverable termination and unrecoverable termination.

For example, upon a condition that the battery of the chargeable device (terminal) is full or a bad contact of the charging interface is detected, the charging process terminates, the charging communication process resets, and the charging process enter Stage 1 again. Afterwards, the charging process enters Stage 2 if the chargeable device (terminal) does not agree the second adapter to charge the chargeable device (terminal) by the second charging mode. Such kind of termination of the charging process is regarded as unrecoverable termination.

Or for example, when the communication between the second adapter and the chargeable device (terminal) is abnormal, the charging process terminates, the charging communication process resets, and the charging process enters Stage 1 again. After the requirement of Stage 1 is fulfilled, the chargeable device (terminal) agrees the second adapter to charge the chargeable device (terminal) under the second charging mode to recover the charging process. Such kind of termination of the charging process may be regarded as recoverable termination.

Or for example, when the chargeable device (terminal) detects the battery is abnormal, the charging process terminates, the charging process resets, and the charging process enters Stage 1 again. Afterwards, the chargeable device (terminal) does not agree the adapter to charge the chargeable device (terminal) under the second charging mode. When the battery (the multiple cells) becomes normal again, and the requirement of Stage 1 is fulfilled, the chargeable device (terminal) agrees the adapter to charge the chargeable device (terminal) under the second charging mode. Such kind of termination of the charging process may be regarded as recoverable termination.

The blocks or operations illustrated in FIG. 5B are merely an exemplary. For example, after the chargeable device (terminal) and the second adapter are coupled at Stage 1, handshake communication between the chargeable device (terminal) and the second adapter may be launched by the chargeable device (terminal) as well; that is the chargeable device (terminal) sends Instruction 1 and inquires whether the second adapter enables the second charging mode. When the chargeable device (terminal) receives the reply instruction responsive to the second adapter to command the second adapter to agree to charge the chargeable device (terminal) by the second charging mode, the second adapter starts to charge the battery of the chargeable device (terminal) by the second charging mode.

In another embodiment, a stage of constant voltage charging may be further included after Stage 5 finishes. Specifically, the chargeable device (terminal) feedbacks the present voltage of the battery (the present total voltage of the multiple cells) to the second adapter at Stage 5. When the present voltage of the battery (the present total voltage of the multiple cells) reaches a threshold of charging voltage, the chargeable device (terminal) is charged by a constant voltage from the constant current. At the stage of constant voltage charging, the charging current gradually lessens. When the charging current lowers to a certain threshold, the battery of the chargeable device (terminal) is filled.

Alternatively, in some embodiments, the second adapter directly couples its output current to the positive terminal and negative terminal of the battery of the chargeable device (terminal), directly charging the battery.

Specifically, direct charging may refer to directly coupling (or directly leading) the output voltage and output current of the second adapter to the positive terminal and negative terminal of the battery of the chargeable device (terminal). It does not need to go through a converter circuit to convert the output voltage or output current of the second adapter to avoid energy loss caused by the conversion process. In the process of charging in the second charging mode, in order to be able to adjust the charging voltage or charging current on the charging circuit, the second adapter can be designed as an intelligent adapter, so that the second adapter can complete the conversion of the charging voltage or charging current. It can reduce the load of and the heat emitted by the chargeable device (terminal).

The second adapter 10 of the embodiment of the present disclosure can operate in a constant current mode. The constant current mode herein refers to a charging mode in which control is exercised on the output current of the second adapter, instead of keeping the output current of the second adapter to stay constant. In practice, the second adapter in a constant current mode typically adopts a multi-stage constant current charging.

The multi-stage constant current charging has N charging stages (N is an integer equal to or larger than 2). The multi-stage constant current charging can begin the first stage charging by a predetermined charging current. The N charging stages of the multi-stage constant current charging are executed sequentially from the first stage to the (N−1) stage. When the previous charging stage is shifted to the next charging stage in the charging process, the charging current gradually decreases. When the battery voltage reaches the charge cut-off voltage, the previous charging stage will transit to the next charging stage in the charging process.

Figure 6:
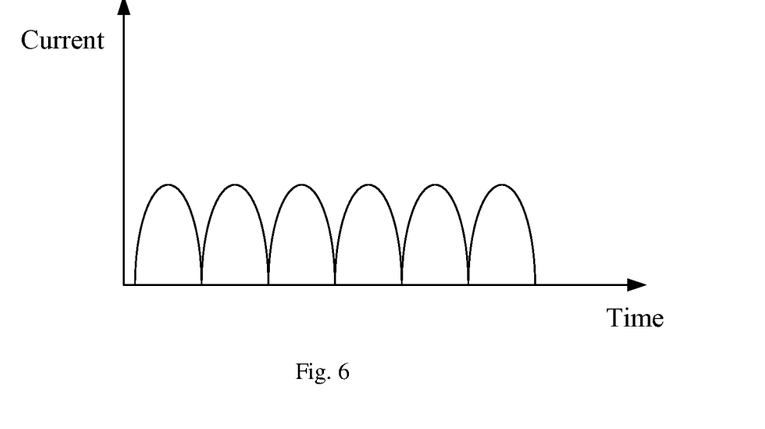
FIG. 6 illustrates a waveform of a pulsating direct current.

Alternatively, in some embodiments, in the second charging mode, the output current of the second adapter is a pulsating direct current (also known as unidirectional pulsating output current, or pulsating waveform current, or clipped pulsating waveform current). The waveform of the pulsating direct current is illustrated in FIG. 6.

Figure 7:
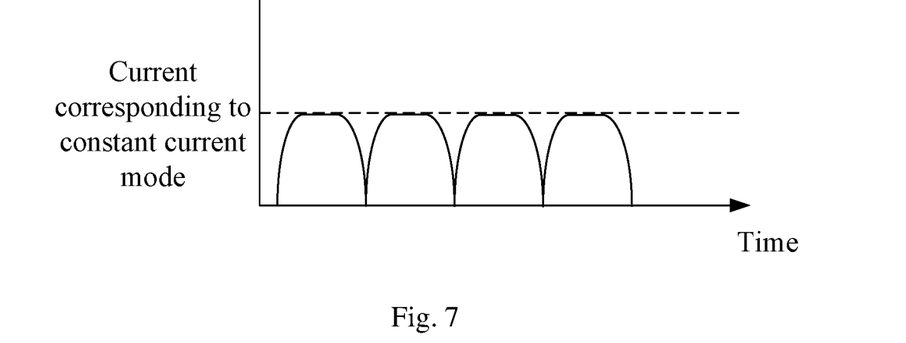
FIG. 7 illustrates a waveform of a pulsating direct current under the constant current mode according to one embodiment of the present disclosure.

Alternatively, in some embodiments, in cases where the output current of the second adapter is a pulsating direct current, constant current mode may refer to a charging mode that exercises control over the peak value or average value of the pulsating direct current, i.e. controlling the peak value of the output current of the second adapter not exceeding the corresponding current of the constant current mode, as illustrated in FIG. 7.

Alternatively, in some embodiments, in the second charging mode, the output current of the second adapter is an alternating current, which can also reduce lithium precipitation of lithium batteries and improve the lifespan of the cell.

Figure 8:
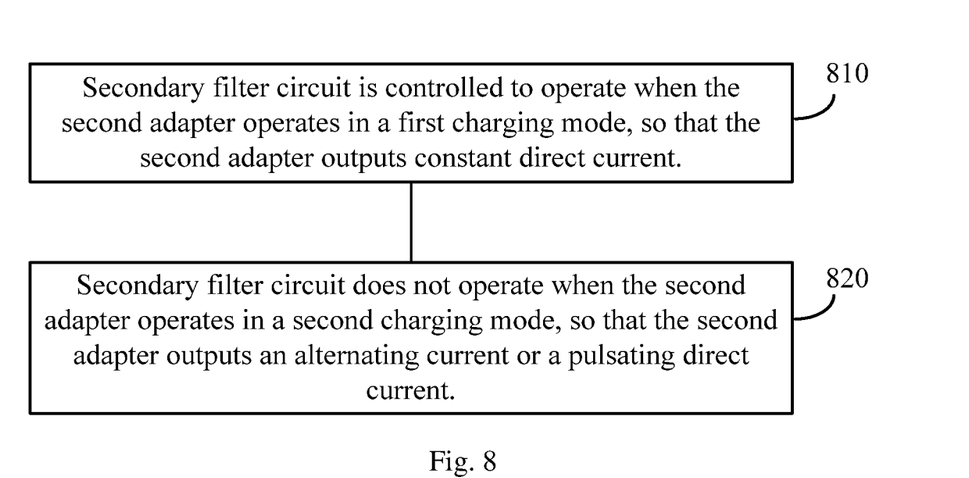
FIG. 8 illustrates a flowchart of a method of controlling a charging process according to one embodiment of the present disclosure.

The aforementioned texts, in conjunction with FIGS. 1 to 7, describe the device of the embodiments of the present disclosure in detail. The following texts, in conjunction with FIG. 8, illustrate an embodiment of the method of the embodiments of the present disclosure in detail. It should be understood that the description on the method and device are references to each other, and some repetitive descriptions have been removed for the sake of succinctness.

FIG. 8 illustrates a flowchart of a method of controlling a charging process according to an embodiment of the present disclosure. The method illustrated in FIG. 8 is performed by the second adapter as illustrated in FIGS. 1-7. The second adapter includes a power converting circuit configured to convert inputted alternating current (AC) to generate output voltage and output current. The power converting circuit includes a secondary filter circuit.

The method illustrated in FIG. 8 includes a block 810 and a block 820.

At block 810, the secondary filter circuit is controlled to operate when the second adapter operates in a first charging mode, so that the second adapter outputs constant direct current.

At block 820, the secondary filter circuit does not operate when the second adapter operates in a second charging mode, so that the second adapter outputs an alternating current or a pulsating direct current.

Alternatively, in some embodiments, a capacitor of the secondary filter circuit is a solid capacitor.

Alternatively, in some embodiments, the secondary filter circuit includes a plurality of solid capacitors coupled to a secondary bus line of the adapter and ground.

Alternatively, in some embodiments, a speed by which the second adapter charges the chargeable device by the second charging mode is faster than a speed by which the second adapter charges the chargeable device in the first charging mode. The method illustrated in FIG. 8 further includes: engaging in a bidirectional communication with the chargeable device to control the output of the second adapter operable in the second charging mode when the second adapter coupled to the chargeable device is operable in the second charging mode.

Alternatively, in some embodiments, the bidirectionally communicating with the chargeable device to control the output of the second adapter operable in the second charging mode when the second adapter coupled to the chargeable device is operable in the second charging mode, includes: bidirectionally communicating with the chargeable device to negotiate a charging mode which the chargeable device and the second adapter are operable in.

Alternatively, in some embodiments, the bidirectionally communicating with the chargeable device to negotiate a charging mode which the chargeable device and the second adapter are operable in includes: sending a first instruction to the chargeable device, the first instruction configured to inquire whether the chargeable device enables the second charging mode, receiving a reply instruction responsive to the first instruction sent by the chargeable device, which is configured to indicate whether the chargeable device approves to enable the second charging mode, and charging the chargeable device by the second charging mode when the chargeable device approves to enable the second charging mode.

Alternatively, in some embodiments, the bidirectionally communicating with the chargeable device to control the output of the second adapter operable in the second charging mode when the second adapter coupled to the chargeable device is operable in the second charging mode includes: bidirectionally communicating with the chargeable device to determine the charging voltage outputted by the second adapter to charge the chargeable device by the second charging mode, and adjusting the output voltage of the second adapter so that the output voltage of the second adapter is equal to the charging voltage outputted by the second adapter to charge the chargeable device by the second charging mode.

Alternatively, in some embodiments, the bidirectionally communicating with the chargeable device to determine the charging voltage outputted by the second adapter to charge the chargeable device by the second charging mode includes: sending to the chargeable device a second instruction, which is configured to inquire whether the output voltage of the second adapter is equal to the present voltage of the battery in the chargeable device, receiving a reply instruction responsive to the second instruction sent by the chargeable device, which is configured to indicate whether the output voltage of the second adapter matches, or is higher or lower than the present voltage of the battery.

Alternatively, in some embodiments, the bidirectionally communicating with the chargeable device to control the output of the second adapter operable in the second charging mode when the second adapter coupled to the chargeable device is operable in the second charging mode includes: bidirectionally communicating with the chargeable device to determine the charging current outputted by the second adapter to charge the chargeable device in the second charging mode, and adjusting the output current of the second adapter, so that the output current of the second adapter is equal to the charging current outputted by the second adapter to charge the chargeable device in the second charging mode.

Alternatively, in some embodiments, the bidirectionally communicating with the chargeable device to determine the charging current outputted by the second adapter to charge the chargeable device in the second charging mode includes: sending to the chargeable device a third instruction, which is configured to inquire the maximum charging current presently supported by the chargeable device, receiving a reply instruction responsive to the third instruction sent by the chargeable device, which is configured to show the maximum charging current presently supported by the chargeable device, and determining the charging current outputted by the second adapter to charge the chargeable device by the second charging mode based on a maximum charging current presently supported by the chargeable device.

Alternatively, in some embodiments, the bidirectionally communicating with the chargeable device to control the output of the second adapter operable in the second charging mode when the second adapter coupled to the chargeable device is operable in the second charging mode includes: bidirectionally communicating with the chargeable device to adjust the output current of the second adapter.

Alternatively, in some embodiments, the bidirectionally communicating with the chargeable device to adjust the output current of the second adapter includes: sending to the chargeable device a fourth instruction, which is configured to inquire the present voltage of the battery of the chargeable device, and receiving a reply instruction responsive to the fourth instruction sent by the chargeable device, which is configured to indicate the present voltage of the battery; and adjusting the output current of the second adapter based on the present voltage of the battery.

Alternatively, in some embodiments, the second adapter comprises a charging interface, and the second adapter performs bidirectional communication with the chargeable device through a data line of the charging interface.

Alternatively, in some embodiments, the output current of the second adapter operable in the second charging mode is a pulsating direct current.

Alternatively, in some embodiments, the output current of the second adapter operable in the second charging mode is an alternating current.

Alternatively, in some embodiments, the output voltage and output current of the second adapter are directly applied a positive terminal and a negative terminal of a battery in the chargeable device to directly charge the battery in the second charging mode.

Alternatively, in some embodiments, the second adapter comprises a control circuit configured to control the charging process; the control circuit is a microcontroller unit (MCU).

Alternatively, in some embodiments, the second adapter comprises a charging interface, which is an universal serial bus (USB) interface.

It is understood by one skilled in the art that the "first adapter" and "second adapter" are used for illustrative purposes only but are not limited to a specific type adapter.

One having ordinary skill in the art may be aware that the units and steps of algorithm in the examples of the embodiments published by this application can be realized by electronic hardware, or combinations of computer software and electronic hardware. Whether the functions should be performed by hardware or software should depend upon the particular applications and design constraints of a technical solution. One skilled in the art may use different methods to implement the described functions for each specific application, but such implementation should not be considered as outside of the scope of the present disclosure.

One skilled in the art may clearly understand that they can refer to the corresponding process in the abovementioned embodiments of the method for the specific operating process of the abovementioned system, device, and units. No description is provided herein again for the convenience and succinctness of the description.

In the several embodiments provided by the application, it should be understood that the revealed system, device and method may be implemented in other ways. For example, the abovementioned embodiments of the device are merely schematic. For example, the division of the units is merely a division based on logical functions; it may be different when they are put into practice. For example, a plurality of units or components may be combined or integrated into another system, or some features may be ignored or not be performed. And another point is that the displayed or discussed coupling, direct coupling or communication can be done through some interfaces, devices, or indirect coupling or communication between units; they may be electrical, mechanical, or in other forms.

The units described as separated parts may or may not be physically separated. A part that appeared as a unit may or may not be a physical unit, i.e. it can locate in one place, or it can be distributed to multiple network units. Part of or all of the units can be selected based on actual needs to achieve the object of the solutions of the present embodiments.

Furthermore, each of the functional units in the embodiments of the present disclosure may be integrated in one processing unit, or may be independent units physically separated, or may integrate with another one or more units and appear as a single unit.

If the function is realized as a software functional unit and used or sold as a standalone product, it may be stored in a computer-readable storage medium. Based on such understanding, the technical solutions of the present disclosure per se, or its contribution to the related art, or the technical solution may be realized in a software product. The computer software product is stored in a storage medium, including several commands that enable a computer device (may be a personal computer, a server, or network device) to perform all or part of the steps of the methods of the various embodiments of the present disclosure. The storage medium includes U-disk, removable hard disk, read-only memory (ROM), random access memory (RAM), magnetic disk or compact disc (CD) and other medium that can store program codes.

The above texts are merely specific embodiments of the present disclosure. However, the scope of the present disclosure is not limited hereto. Any variations or alternatives that can easily be thought of by technicians familiar with the field should fall within the scope of the present disclosure. Therefore, the scope of the present disclosure should be defined by the scope of the claims.

What is claimed is:

1. An adapter supporting a first charging mode and a second charging mode, comprising:
   a power converting circuit, configured to convert an inputted alternating current (AC) to generate an output voltage and an output current of the adapter, the power converting circuit comprising a secondary filter circuit, wherein the power converting circuit comprises a primary side and a secondary side, the secondary filter circuit is configured to filter current, coupling from the primary side to the secondary side of the power converting circuit, after being rectified, wherein the secondary filter circuit is grounded via a switch transistor; and
   a control circuit, coupled to the secondary filter circuit, configured to control the secondary filter circuit to operate, via controlling the switch transistor to be conducted, when the adapter operates in the first charging mode, so that the adapter outputs a constant direct current for charging a chargeable device, and configured to control the secondary filter circuit not to operate, via controlling the switch transistor to be not conducted, when the adapter operates in the second charging mode, so that the adapter outputs an alternating current or a pulsating direct current for charging the chargeable device; wherein a charging speed of the adapter in the second charging mode is greater than a charging speed of the adapter in the first charging mode when the adapter charges the chargeable device.

2. The adapter as claimed in claim 1, wherein the secondary filter circuit comprises a plurality of solid capacitors coupled to a secondary bus line of the adapter and ground.

3. The adapter as claimed in claim 1, wherein when the adapter is coupled to the chargeable device, the control circuit bidirectionally communicates with the chargeable device to control an output of the adapter operable in the second charging mode.

4. The adapter as claimed in claim 1, wherein the control circuit is configured to bidirectionally communicate with the chargeable device to negotiate that the chargeable device and the adapter are selectively operable in the first charging mode and the second charging mode.

5. The adapter as claimed in claim 4, wherein when the control circuit bidirectionally communicates with the chargeable device,
the control circuit is configured to send a first instruction to the chargeable device, the first instruction configured to inquire whether the chargeable device enables the second charging mode;
the control circuit is further configured to receive a reply instruction responsive to the first instruction sent by the chargeable device, the reply instruction responsive to the first instruction configured to indicate whether the chargeable device approves to enable the second charging mode; and
the control circuit is further configured to charge the chargeable device by the second charging mode when the chargeable device approves to enable the second charging mode.

6. The adapter as claimed in claim 3, wherein when the control circuit bidirectionally communicates with the chargeable device to control the output of the adapter operable in the second charging mode,
the control circuit is configured to bidirectionally communicate with the chargeable device to determine a charging voltage outputted by the adapter operable in the second charging mode to charge the chargeable device; and
the control circuit is configured to adjust the output voltage of the adapter so that the output voltage of the adapter is equal to the charging voltage outputted by the adapter operable in the second charging mode to charge the chargeable device.

7. The adapter as claimed in claim 6, wherein when the control circuit bidirectionally communicates with the chargeable device to determine the charging voltage outputted by the adapter operable in the second charging mode to charge the chargeable device,
the control circuit is configured to send to the chargeable device a second instruction, which is configured to inquire whether the output voltage of the adapter is equal to a present voltage of the battery in the chargeable device; and
the control circuit is further configured to receive a reply instruction responsive to the second instruction sent by the chargeable device, the reply instruction responsive to the second instruction configured to indicate whether the output voltage of the adapter matches, or is higher or lower than the present voltage of the battery.

8. The adapter as claimed in claim 3, wherein when the control circuit bidirectionally communicates with the chargeable device to control the output of the adapter operable in the second charging mode,
the control circuit is configured to bidirectionally communicate with the chargeable device to determine a charging current outputted by the adapter operable in the second charging mode to charge the chargeable device; and
the control circuit is further configured to adjust the output current of the adapter, so that the output current of the adapter is equal to the charging current outputted by the adapter operable in the second charging mode to charge the chargeable device.

9. The adapter as claimed in claim 8, wherein when the control circuit bidirectionally communicates with the chargeable device to determine the charging current outputted by the adapter operable in the second charging mode to charge the chargeable device,
the control circuit is configured to send to the chargeable device a third instruction, the third instruction configured to inquire a maximum charging current presently supported by the chargeable device;
the control circuit is further configured to receive a reply instruction responsive to the third instruction sent by the chargeable device, the reply instruction responsive to the third instruction configured to show the maximum charging current presently supported by the chargeable device; and
the control circuit is further configured to determine the charging current outputted by the adapter operable in the second charging mode to charge the chargeable device according to the maximum charging current presently supported by the chargeable device.

10. The adapter as claimed in claim 3, wherein when the control circuit bidirectionally communicates with the chargeable device to control the output of the adapter operable in the second charging mode,
the control circuit is configured to bidirectionally communicate with the chargeable device to adjust the output current of the adapter.

11. The adapter as claimed in claim 10, wherein when the control circuit bidirectionally communicates with the chargeable device to adjust the output current of the adapter,
the control circuit is configured to send to the chargeable device a fourth instruction, the fourth instruction configured to inquire a present voltage of the battery of the chargeable device;
the control circuit is further configured to receive a reply instruction responsive to the fourth instruction sent by the adapter, the reply instruction responsive to the fourth instruction configured to indicate the present voltage of the battery; and
the control circuit is further configured to adjust the output current of the adapter according to the present voltage of the battery.

12. The adapter as claimed in claim 3, wherein the adapter comprises a charging interface, and the control circuit bidirectionally communicates with the chargeable device through a data line of the charging interface.

13. The adapter as claimed in claim 1, wherein the output current of the adapter operable in the second charging mode is the pulsating direct current or the alternating current.

14. A method of controlling a charging process, applied in an adapter comprising a power converting circuit configured to convert an inputted alternating current (AC) to generate an output voltage and an output current, the power converting circuit comprising a secondary filter circuit, wherein the power converting circuit comprises a primary side and a secondary side, the secondary filter circuit is configured to filter current, coupling from the primary side to the secondary side of the power converting circuit, after being rectified, wherein the secondary filter circuit is grounded via a switch transistor, the method comprising:
controlling the secondary filter circuit to operate, via controlling the switch transistor to be conducted, when the adapter operates in a first charging mode, so that the adapter outputs a constant direct current for charging a chargeable device; and
controlling the secondary filter circuit not to operate, via controlling the switch transistor to be not conducted, when the adapter operates in a second charging mode, so that the adapter outputs an alternating current or a pulsating direct current for charging the chargeable device; wherein a charging speed of the adapter in the second charging mode is greater than a charging speed of the adapter in the first charging mode when the adapter charges the chargeable device.

15. The method as claimed in claim 14, wherein the secondary filter circuit comprises a plurality of solid capacitors coupled to a secondary bus line of the adapter and ground.

16. The method as claimed in claim 14, the method further comprises:
   bidirectionally communicating with the chargeable device to control an output of the adapter operable in the second charging mode when the adapter coupled to the chargeable device is operable in the second charging mode.

17. The method as claimed in claim 14, further comprising:
   bidirectionally communicating with the chargeable device to negotiate that the chargeable device and the adapter are selectively operable in the first charging mode and the second charging mode.

18. The method as claimed in claim 17, wherein the bidirectionally communicating with the chargeable device to negotiate that the chargeable device and the adapter are selectively operable in the first charging mode and the second charging mode, comprises:
   sending a first instruction to the chargeable device, the first instruction configured to inquire whether the chargeable device enables the second charging mode;
   receiving a reply instruction responsive to the first instruction sent by the chargeable device, the reply instruction responsive to the first instruction configured to indicate whether the chargeable device approves to enable the second charging mode; and
   charging the chargeable device by the second charging mode when the chargeable device approves to enable the second charging mode.

19. The method as claimed in claim 16, wherein the bidirectionally communicating with the chargeable device to control the output of the adapter operable in the second charging mode when the adapter coupled to the chargeable device is operable in the second charging mode, comprises:
   bidirectionally communicating with the chargeable device to determine a charging voltage outputted by the adapter operable in the second charging mode to charge the chargeable device; and
   adjusting the output voltage of the adapter so that the output voltage of the adapter is equal to the charging voltage outputted by the adapter operable in the second charging mode to charge the chargeable device.

20. The method as claimed in claim 19, wherein the bidirectionally communicating with the chargeable device to determine the charging voltage outputted by the adapter operable in the second charging mode to charge the chargeable device, comprises:
   sending to the chargeable device a second instruction, the second instruction configured to inquire whether the output voltage of the adapter is equal to a present voltage of the battery in the chargeable device; and
   receiving a reply instruction responsive to the second instruction sent by the chargeable device, the reply instruction responsive to the second instruction configured to indicate whether the output voltage of the adapter matches, or is higher or lower than the present voltage of the battery.

21. The method as claimed in claim 16, wherein the bidirectionally communicating with the chargeable device to control the output of the adapter operable in the second charging mode when the adapter coupled to the chargeable device is operable in the second charging mode, comprises:
   bidirectionally communicating with the chargeable device to determine a charging current outputted by the adapter operable in the second charging mode to charge the chargeable device; and
   adjusting the output current of the adapter, so that the output current of the adapter is equal to the charging current outputted by the adapter operable in the second charging mode to charge the chargeable device.

22. The method as claimed in claim 21, wherein the bidirectionally communicating with the chargeable device to determine the charging current outputted by the adapter operable in the second charging mode to charge the chargeable device comprises:
   sending to the chargeable device a third instruction, the third instruction configured to inquire a maximum charging current presently supported by the chargeable device;
   receiving a reply instruction responsive to the third instruction sent by the chargeable device, the reply instruction responsive to the third instruction configured to show the maximum charging current presently supported by the chargeable device; and
   determining the charging current outputted by the adapter operable in the second charging mode to charge the chargeable device based on the maximum charging current presently supported by the chargeable device.

23. The method as claimed in claim 16, wherein the bidirectionally communicating with the chargeable device to control the output of the adapter operable in the second charging mode when the adapter coupled to the chargeable device is operable in the second charging mode, comprises:
   bidirectionally communicating with the chargeable device to adjust the output current of the adapter.

24. The method as claimed in claim 23, wherein the bidirectionally communicating with the chargeable device to adjust the output current of the adapter comprises:
   sending to the chargeable device a fourth instruction, the fourth instruction configured to inquire a present voltage of the battery of the chargeable device;
   receiving a reply instruction responsive to the fourth instruction sent by the adapter, the reply instruction responsive to the fourth instruction configured to indicate the present voltage of the battery; and
   adjusting the output current of the adapter based on the present voltage of the battery.

25. The method as claimed in claim 16, wherein the adapter comprises a charging interface, and the control circuit bidirectionally communicates with the chargeable device through a data line of the charging interface.

26. The method as claimed in claim 14,
   wherein the output current of the adapter operable in the second charging mode is the pulsating direct current or the alternating current.

* * * * *